United States Patent
Biswal et al.

(10) Patent No.: US 6,477,399 B2
(45) Date of Patent: Nov. 5, 2002

(54) METHOD FOR DETERMINING THE RELIABILITY OF FMRI PARAMETERS

(75) Inventors: Bharat B. Biswal, Milwaukee, WI (US); Paul A. Taylor, Elm Grove, WI (US); John L. Ulmer, Brookfield, WI (US)

(73) Assignee: MCW Research Foundation, Inc., Milwaukee, WI (US)

( * ) Notice: Subject to any disclaimer, the term of this patent is extended or adjusted under 35 U.S.C. 154(b) by 15 days.

(21) Appl. No.: 09/821,593

(22) Filed: Mar. 29, 2001

(65) Prior Publication Data

US 2002/0082495 A1 Jun. 27, 2002

Related U.S. Application Data

(60) Provisional application No. 60/193,045, filed on Mar. 29, 2000.

(51) Int. Cl.$^7$ ............................................. A61B 5/055
(52) U.S. Cl. ...................................... 600/410; 324/309
(58) Field of Search ............................. 600/410, 9, 14; 324/300, 307, 309

(56) References Cited

U.S. PATENT DOCUMENTS 5,425,368 A * 6/1995 Brandt ........................ 600/410
5,603,322 A    2/1997 Jesmanowicz et al.
5,652,515 A * 7/1997 Kondo ......................... 324/309
5,662,112 A * 9/1997 Heid ........................... 324/309
5,869,964 A * 2/1999 Kuhara et al. ............... 324/307
2001/0056231 A1 * 12/2001 Jesmanowicz et al. ...... 600/410

FOREIGN PATENT DOCUMENTS

JP            5-123314       * 5/1993    ........... A61B/5/055

OTHER PUBLICATIONS

Use of Jackknife Resampling Techniques to Estimate the Confidence Intervals of fMRI Parameters, Journal of Computer Assisted Tomography 25(1):113–120, Biswal, et al.

* cited by examiner

Primary Examiner—Hieu T. Vo
(74) Attorney, Agent, or Firm—Quarles & Brady, LLP

(57) ABSTRACT

An EPI pulse sequence is performed by an MRI system which acquires images of the brain over a time interval during which the subject performs a function or is stimulated in a pattern. An fMRI parameter is calculated for each voxel which indicates those regions of the brain that are active during the study. The same acquired NMR data is employed in a jackknife method for recalculating the fMRI parameter many times and from the distribution of the recalculated values a confidence level indicator is produced. Low confidence level indicators are used to exclude regions which are otherwise indicated as active.

5 Claims, 4 Drawing Sheets

METHOD FOR DETERMINING THE RELIABILITY OF FMRI PARAMETERS

RELATED APPLICATIONS

This application claims benefit of provisional application Serial No. 60/193,045 filed on Mar. 29, 2000.

BACKGROUND OF THE INVENTION

The field of the invention is nuclear magnetic resonance imaging methods and systems. More particularly, the invention relates to the production of brain function images.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant gamma γ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped" into the x-y plane to produce a net transverse magnetic moment $M_t$, which is rotating, or spinning, in the x-y plane at the Larmor frequency. The practical value of this phenomenon resides in the signal which is emitted by the excited spins after the excitation signal $B_1$ is terminated. There are a wide variety of measurement sequences in which this nuclear magnetic resonance ("NMR") phenomena is exploited.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

The imaging of brain functions with magnetic resonance imaging systems has been done using fast pulse sequences. As described by J. Frahm et al in "Dynamic MR Imaging of Human Brain Oxygenation During Rest and Photic Stimulation", *JMRI* 1992:2:501–505; K. Kwong et al in "Dynamic Magnetic Resonance Imaging of Human Brain Activity During Primary Sensory Stimulation" *Proc. Natl. Acad. Sci USA* Vol. 89, pp 5675–5679, June 1992 Neurobiology; and S. Ogawa et al, "Intrinsic Signal Changes Accompanying Sensory Stimulation: Functional Brain Mapping Using MRI", *Proc. Natl Acad. Sci USA* Vol. 89, pp. 5951–5955, June 1992 Neurobiology, these prior methods use a difference technique in which a series of image data sets are acquired with an EPI pulse sequence while a particular function is being performed by the patient, and a baseline image data set is acquired with no patient activity. The baseline data set is subtracted from the series of data sets to produce difference images that reveal those parts of the brain that were active during the performance of the function. These difference images may be displayed in sequence to provide a cine display of the activity-induced brain functions. In this case the fMRI parameter which distinguishes active and inactive regions of the brain is signal amplitude difference.

The difference in NMR signal level produced By regions of the brain that are active and those that are inactive is very small. The difference is believed to result from the increase in oxygen supply to active portions of the brain which decreases the susceptibility differential between vessels and surrounding tissues. This allows an increase in the phase coherence of spins and a resulting increase in NMR signal level. However, this difference in signal level is only 2 to 4 percent (at 1.5 Tesla) and is masked by system noise, and artifacts caused by patient motion, brain pulsatility, blood flow and CSF flow.

An improved method for determining which regions of the brain are active is described in U.S. Pat. No. 5,603,322. Rather than relying on signal amplitude differences as a measure of activity, the disclosed method correlates the changes in the signal level over the duration of the study with the changes in the function being performed, or stimulation applied to the subject. The signal pattern of regions that are active in response to the function or stimulation correlates highly with the function or stimulation pattern and these regions are designated "active". In this case the fMRI parameter which distinguishes active and inactive regions of the brain is a correlation number.

As one uses fMRI to answer more complex questions (for example, the difference in activation pattern between two or more tasks), the relative difference in signal intensity between the conditions becomes even less than 2 to 5 percent. In addition, it has been discovered that the fMRI signal from unactivated regions in the brain can vary by as much as 1 percent. Before any definitive conclusions can be made about the fMRI results in a study, therefore, the signal's reliability and variability both within a subject and between subjects must be determined.

To understand the statistical reliability of an estimate such as the correlation coefficient, suppose that the correlation coefficient value of 0.65 were obtained between a pixel time course (70 points) from the sensorimotor cortex and an idealized reference waveform representing the "on/off" cycle of bilateral finger tapping. If there were a 95% probability that the correlation coefficients would lie between 0.64 and 0.66, then the correlation coefficient of 0.65 could be considered to be very reliable. However, if the correlation probability distribution were evenly spread between −1 and 1, then the obtained correlation coefficient would not be reliable.

Hence, some measure is needed to assess the statistical accuracy and reliability of the correlation coefficient or of any other statistical parameter of interest used in fMRI.

Traditionally, the reliability of fMRI data has been obtained by using test-retest analysis. As its name suggests, in test-retest analysis, the same task is repeated several times using identical imaging parameters. The data obtained are then processed, and the reliability of the data sets is measured using a number of different techniques. Test-retest analysis assumes that the task activation paradigm can be repeated a number of times under identical conditions, without any learning or habituation by the subject to alter neuron firing. In each of the test-retest analysis, the experiment must be repeated several times (three or more) to obtain the reliability criteria.

Although this method might be effective in analyzing simple motor or visual tasks, for more complex tasks, this assumption will not be valid. Even for a simple finger-tapping experiment, not only must the imaging parameters be identical for each of the scans, but also the stimulus-related parameters, including the finger-tapping rate and the on/off cycle timing, must be the same. Any deviation from the specified finger-tapping rate or the on/off cycle in any of the scans would result in erroneous conclusions. With the increase in time of scanning, even motivated subjects are likely to move their heads by at least a few millimeters. Head motion is even more severe for diseased or young subjects, further deteriorating reliability parameters calculated using the test-retest methodology.

SUMMARY OF THE INVENTION

The present invention is a method of producing fMRI images with a designated level of confidence in its depiction of brain activity. More particularly, the method includes: acquiring an fMRI data set; creating a plurality of truncated data sets using a corresponding plurality of different sub-sets of the acquired fMRI data set; calculating an fMRI parameter for the acquired fMRI data set and each of the truncated data sets; determining the distribution of the fMRI parameter calculated from the truncated data sets; and determining a confidence level indicator for the fMRI parameter calculated from the acquired fMRI data set.

A general object of the invention is to improve the reliability of an fMRI image based on a measured fMRI parameter. If the measured fMRI parameter is a correlation number calculated for each image voxel, for example, active regions in the brain are indicated by modulating the intensity or color of corresponding pixels in a display when the correlation number exceeds preset threshold values. The present invention produces a confidence level indicator for each correlation number, and this may be used as a second threshold to exclude voxels which fail to meet the confidence level threshold. For example, even though a voxel has a correlation number of 0.65 which meets the initial criteria as an active voxel, it may not be displayed as active if its confidence level is only 35%.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

Figure 1:
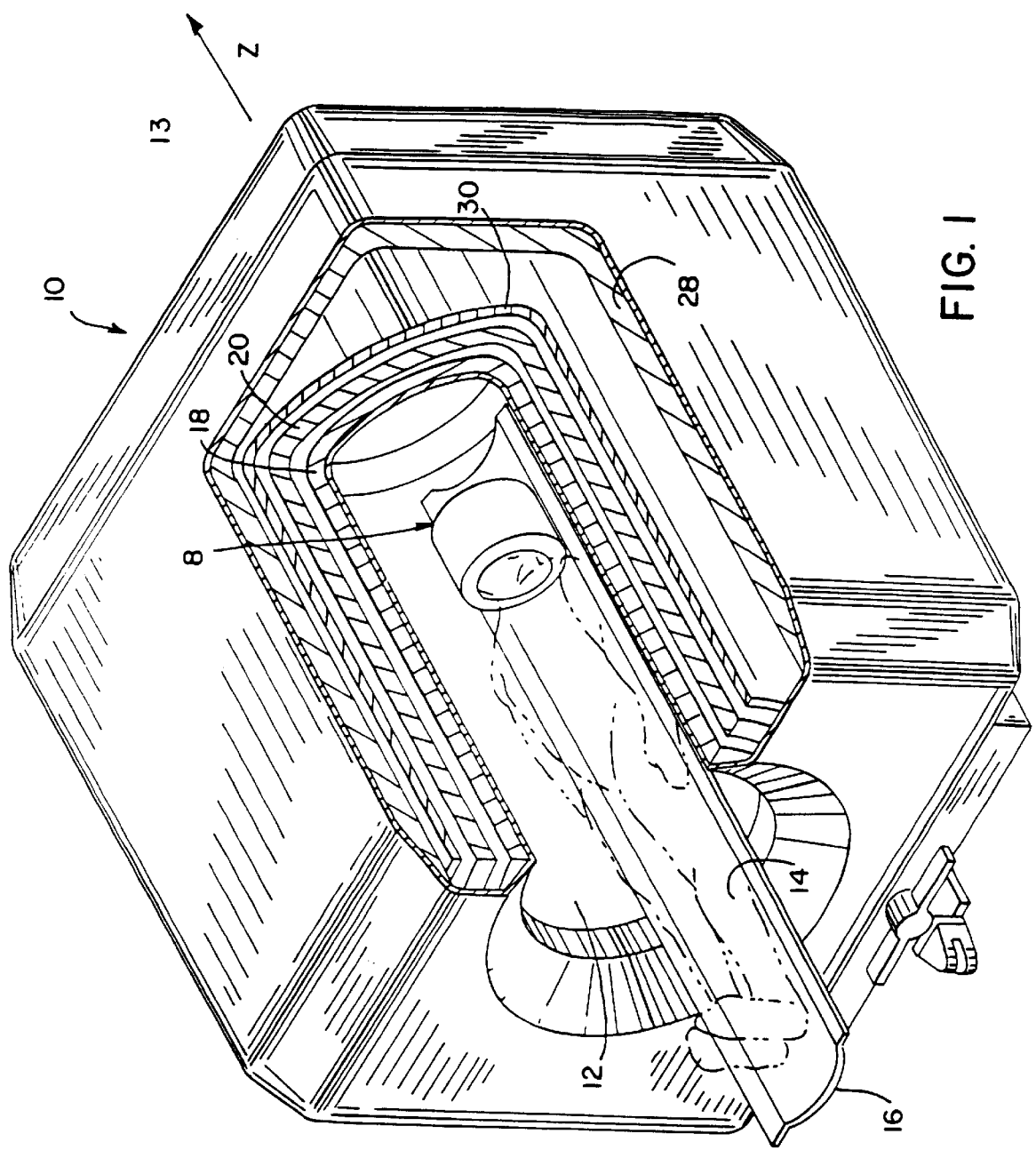
FIG. 1 is a block diagram of an NMR system which employs the present invention.

The present invention employs a method known in the art as the "jackknife" resampling technique to calculate confidence intervals for fMRI parameters produced from a study. The theory underlying this method is as follows. Suppose that $x=\{x_1, x_2, x_3 \ldots, x_N\}$ is an independent, identically distributed sample data set from a population with distribution F. In almost every statistical data analysis, the sample x is studied to estimate a certain unknown parameter, $\theta(F)$, associated with the distribution F. A statistic $Q(x)$, is usually calculated from data set x to estimate $\theta(F)$. A statistically quantitative number of the deviation of $Q(x)$ from $\theta(F)$ is desirable to gauge the reliability of the data. For many applications, the calculated statistic $\theta(x)$ is approximated as a Gaussian distribution with a $(1-\alpha)$ 100% confidence interval for $\theta(F)$. This will be true for a large number of estimators, provided that the sample size, N, is large enough to be asymptotically normal, and an appropriate confidence interval (or any other parameter) for $\theta(F)$ can be obtained, in addition to the calculated statistics, $Q(x)$.

The basis of the jackknifing technique lies in creating the distribution graph of a large population from only a small sample, when traditional methods are either cumbersome or unusable. The original sample is manipulated by repeatedly omitting a small number of data points, always different, thus obtaining a large quantity of various samples. For each truncated data set, the statistic in question is recalculated, and then the variability of the entire group of pseudo-samples can be found when analyzing the results in a probability distribution. One particular advantage with using this technique is that data are analyzed without using a priori assumptions, especially those about distribution. Nor is it limited to analyzing, for example, only Gaussian distribution. Therefore, few estimations and variables are used unnecessarily, resulting in a higher confidence level. The jackknifed data set is simply an approximation of the theoretical distribution of the observed data and is analogous to treating the observed sample as if it exactly represented the entire population.

In the present invention the jackknife technique is applied to calculate a confidence level indicator for the fMRI parameter produced from the fMRI data acquired during the study. Using the above nomenclature, $\theta(F)$ may be either the mean signal increase measured at each voxel during task activation or the correlation coefficient measured at each voxel. The jackknife method produces a confidence level from 0% to 100% which indicates the reliability of each measured fMRI parameter.

The calculated confidence level may be used in a number of ways. The confidence level numbers may simply be displayed along with an indication of their associated fMRI image voxels. On the other hand, the confidence levels may be used as a second test to establish whether a particular voxel was active or inactive during the study. In this case, a confidence level threshold is set (e.g. 85%), and if this level is not met or exceeded, the voxel is indicated as "inactive", even though its fMRI parameters (e.g. correlation number) exceeds the established threshold for an active voxel.

DESCRIPTION OF THE PREFERRED EMBODIMENT

Referring to FIG. 1, an MRI magnet assembly 10 has a cylindrical bore tube 12 extending along a z-axis 13 for receiving a supine patient 14 supported on a table 16. The table 16 may move in and out of the bore tube 12 so as to position the patient 14 along the z-axis 13 within the volume of the bore tube 12.

Coaxially surrounding the bore tube 12 is a whole-body RF coil 18 for exciting the spins of the patient 14 into resonance, as has been described. Whole-body gradient coils 20 surround both the bore tube 12 and the RF coil 18 and are also coaxial with the z-axis 13, to provide x, y and z gradient fields $G_x$, $G_y$ and $G_z$ as required for MRI imaging. The gradient coils 20 are driven by gradient amplifiers (not shown). The polarizing magnetic field $B_0$, aligned with the z-axis 13 is generated by a superconducting magnet coil 28 coaxial with but outside the bore tube 12, the RF coil 18 and the gradient coils 20. The superconducting magnet coil 28 has no external power supply but operates on an initial current which continues unabated in the zero resistivity windings of the superconducting magnet coil 28.

Interposed between the superconducting magnet coil 28 and the gradient coil 20 is a set of shim coils 30 which are used to correct the homogeneity of the polarizing field $B_0$ as is understood in the art. A set of mechanical linkages and insulators (not shown) rigidly connect each of these coils 18, 20, 28 and 30 together to the bore tube 12 so as to resist relative motions generated by the interaction of their various electromagnetic fields.

When a local coil assembly 8 is used in a general purpose system such as that described above, the whole-body gradient coils 20 and whole-body RF coil 18 are disconnected. The local coil assembly 8 is connected to the x, y and z gradient amplifiers (not shown) on the NMR system and it is connected to the system's transceiver through a transmit/receive switch. The preferred embodiment employs a 3 Tesla MRI system manufactured by Bruker Analytische MeBtechnik GmbH and sold under the trademark BIOSPEC 30/60.

Because the gradient fields are switched at a very high speed when an EPI sequence is used to practice the preferred embodiment of the invention, local gradient coils are employed in place of the whole-body gradient coils 139. These local gradient coils are designed for the head and are in close proximity thereto. This enables the inductance of the local gradient coils to be reduced and the gradient switching rates increased as required for the EPI pulse sequence. The local gradient coil assembly 8 also includes a local brain RF coil. In the preferred embodiment, it is a 16 element bandpass endcapped birdcage coil. This brain RF coil is designed to couple very efficiently to the brain of the subject and less efficiently to the lower part of the head. This results in improved brain image quality compared with larger general purpose head coils that couple uniformly to the entire head as well as the neck. An RF shield surrounds the local brain coil and interior to the local gradient coil. This shield isolates RF radiation from the local gradient coil. The shield is designed to avoid perturbation of time varying gradient fields. For a description of these local gradient coils and the RF coil which is incorporated herein by reference, reference is made to U.S. Pat. No. 5,372,137 filed on Jan. 19, 1993 and entitled "NMR Local Coil For Brain Imaging".

Figure 2:
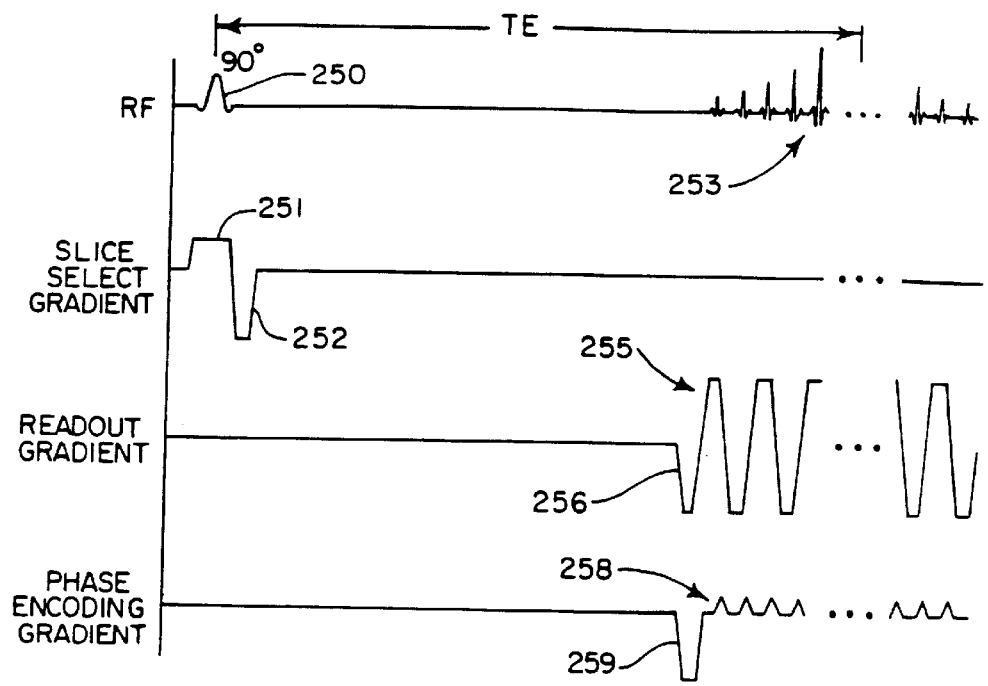
FIG. 2 is a graphic representation of the EPI pulse sequence used to practice the present invention on the NMR system of FIG. 1.

The EPI pulse sequence employed in the preferred embodiment of the invention is illustrated in FIG. 2. A 90° RF excitation pulse 250 is applied in the presence of a $G_z$ slice select gradient pulse 251 to produce transverse magnetization in a slice through the brain ranging from 4 to 25 mm thick. The excited spins are rephased by a negative lobe 252 on the slice select gradient $G_z$ and then a time interval elapses before the readout sequence begins. A total of 64 separate NMR echo signals, indicated generally at 253, are acquired during the EPI pulse sequence. Each NMR echo signal 253 is a different view which is separately phase encoded to scan $k_y$-space from $k_y=-32$ to $k_y=+32$ in monotonic order. The readout sequence is positioned such that the view acquired at $k_y=0$ occurs at the desired echo time (TE). While echo times may range from TE=20 to 120 ms, in brain studies the best functional images have been obtained with echo times of 40 to 50 ms.

The NMR echo signals 253 are gradient recalled echo's produced by the application of an oscillating $G_x$ readout gradient field 255. The readout sequence is started with a negative readout gradient lobe 256 and the echo signals 253 are produced as the readout gradient oscillates between positive and negative values. A total of 64 samples are taken of each NMR echo signal 253 during each readout gradient pulse 255. The successive 64 NMR echo signals 253 are separately phase encoded by a series of $G_y$ phase encoding gradient pulses 258. The first pulse is a negative lobe 259 that occurs before the echo signals are acquired to encode the first view at $k_y=-32$. Subsequent phase encoding pulses 258 occur as the readout gradient pulses 255 switch polarity, and they step the phase encoding monotonically upward through $k_y$ space.

At the completion of the EPI pulse sequence, therefore, 64 separate frequency encoded samples of 128 separately phase encoded NMR echo signals 253 have been acquired. This 64×64 element array of complex numbers is Fourier transformed along both of its dimensions ($k_y$ and $k_x$) to produce a 64×64 element array of image data that indicates the NMR signal magnitude along each of its two dimensions (y and x).

A complete scan is performed in which the EPI pulse sequence is repeated 90 times to acquire time course NMR data for 90 images. The EPI pulse sequences are spaced apart in 2 to 3 seconds intervals such that the entire time course acquisition spans a 4 to 6 minute time period. During that time period the subject is asked to perform a specific function in a predetermined pattern, or a stimulus is applied to the subject in a predetermined pattern. For example, the subject may be instructed to touch each finger to his thumb in a sequential, self-paced, and repetitive manner, or the subject may be subjected to a sensory stimulus such as a smell or visual pattern in a periodic manner. More than one such experiment may be conducted during the scan by varying the repetition rate, phase, or frequency, of the applied stimulus or performed function so that they can be discriminated on the basis of the frequency difference.

The acquired NMR data is processed in the conventional manner to produce an NMR image data set for 90 images. As explained above, a two dimensional Fourier transformation is performed and the resulting NMR image data set is stored for further processing according to the present invention.

Figure 3A:
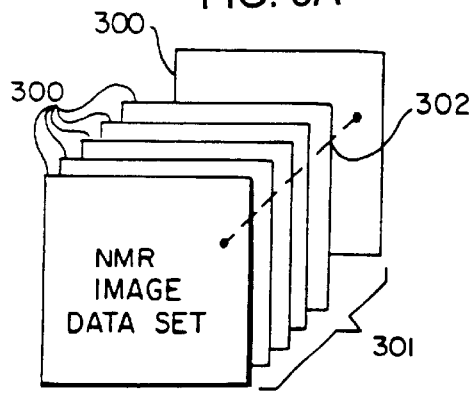
FIG. 3A is a pictorial representation of the NMR image data acquired with the pulse sequence of FIG. 2.

Referring to FIG. 3A, this NMR image data set is organized as a set of 64×64 element 2D arrays 300 in which each element stores the magnitude of the NMR signal from one voxel in the scanned slice. Each array 300 can be used to directly produce an anatomical image of the brain slice for output to the video display 118. While each array 300 is a "snap shot" of the brain slice at a particular time during the time course study, the NMR image data set may also be viewed as a single 64×64×90 3D fMRI data array 301 in which the third dimension is time.

Figure 3B:
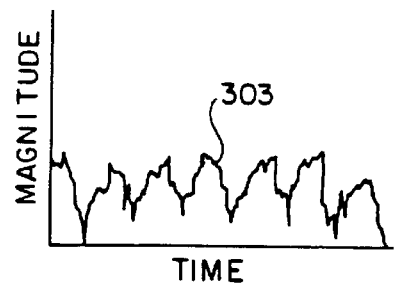
FIG. 3B is a graphic representation of a time domain voxel vector which forms part of the data set of FIG. 3A.

The time course NMR image data for one voxel in the array 301 is referred to herein as a time course voxel vector. One such 90 element vector is illustrated in FIG. 3A by the dashed line 302. Each time course voxel vector 302 indicates the magnitude of the NMR signal at a voxel in the image slice over the time course study. It may be used to produce a graphic display as shown in FIG. 3B. The resulting time domain voxel graph 303 reveals very clearly variations in the activity of the brain in the region of the voxel. Regions which are responsive to a sensory stimulus, for example, can be located by identifying time domain voxel graphs which vary at the same repetition rate as the applied stimulus.

Either of two procedures for producing brain function images can be employed using the time domain data in the fMRI image data set 301. The first is a simple difference image. With this procedure the operator is prompted to select at least two of the 2D arrays 300 in the data set 301. The operator selects one 2D array 300 that is acquired when stimulation is applied and a second 2D array 300 that is acquired when there is no stimulation. A difference image is then produced by subtracting the values of their corresponding voxels. Each voxel in the difference array indicates the difference in NMR signal strength produced by the corresponding region of the brain when the stimulation is applied and removed from the subject. This brain function image may be superimposed on the anatomical brain image to indicate where brain activity is occurring. This superimposition can be a simple addition of corresponding pixel values in the anatomical image and the brain function image to produce a brightness image. In the alternative, the brain function amplitude difference values can be used to control the intensity of a different color or to modulate the color of the image pixels. Regardless of which method is used to modulate the anatomic image with the brain activation image, the present invention is an improvement in which a confidence level is calculated for each difference value in the brain function image before they are used to indicate brain function.

Figure 5:
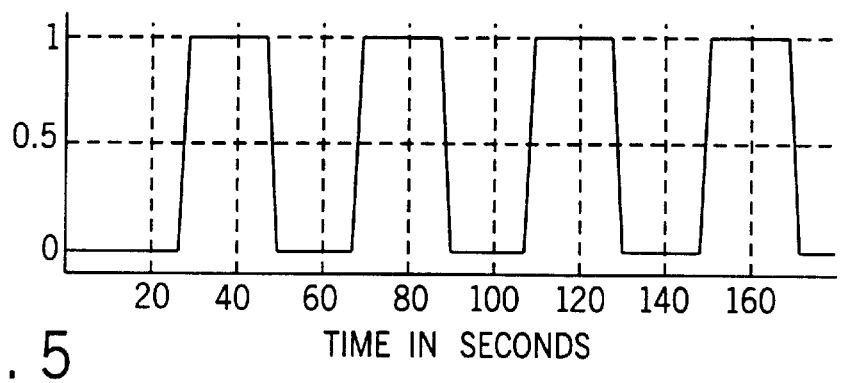
FIG. 5 is a graphic waveform of the reference waveform representative of the subject activity which produced the waveform of FIG. 4.

A second, and more preferred method for producing a brain function image produces a correlation image from the fMRI image data set 301. A reference voxel vector such as that shown in FIG. 5 is manually synthesized to represent the ideal response of the brain to the selected stimulation or function pattern. The 90 element reference voxel vector is correlated with each of the time domain voxel vectors 300 in the NMR image data set 301. This correlation operation may be performed in different ways. The objective, however, is to measure the degree to which each time domain voxel vector resembles, or matches, the pattern of the reference voxel vector. For a more detailed description of the preferred correlation method, reference is made to the above-cited U.S. Pat. No. 5,603,322 which is incorporated herein by reference. The correlation magnitudes that result are scaled to a range of 0 to 1.0. These correlation values may be used to modulate the brightness or color of pixels as described above to indicate brain activity. The present invention is an improvement in which the confidence level is calculated for the correlation values before they are used to indicate brain activity.

Figure 4:
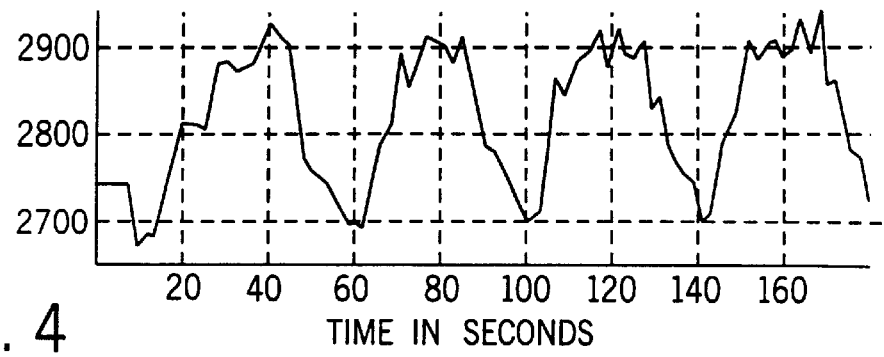
FIG. 4 is a graphic representation of a waveform for an exemplary voxel vector.

In the preferred embodiment of the invention the fMRI data set 301 is examined to calculate confidence intervals for the calculated correlation values. The signal produced by the 90 successive amplitude values in one exemplary voxel vector is depicted in FIG. 4 and the idealized reference voxel vector is depicted in FIG. 5. The correlation of these two waveforms as calculated above is 0.8436. The preferred embodiment of the present invention is implemented by a program which produces a confidence interval for this correlation value and the correlation values for each of the other voxel vectors 302 in the data set 301.

Figure 7:
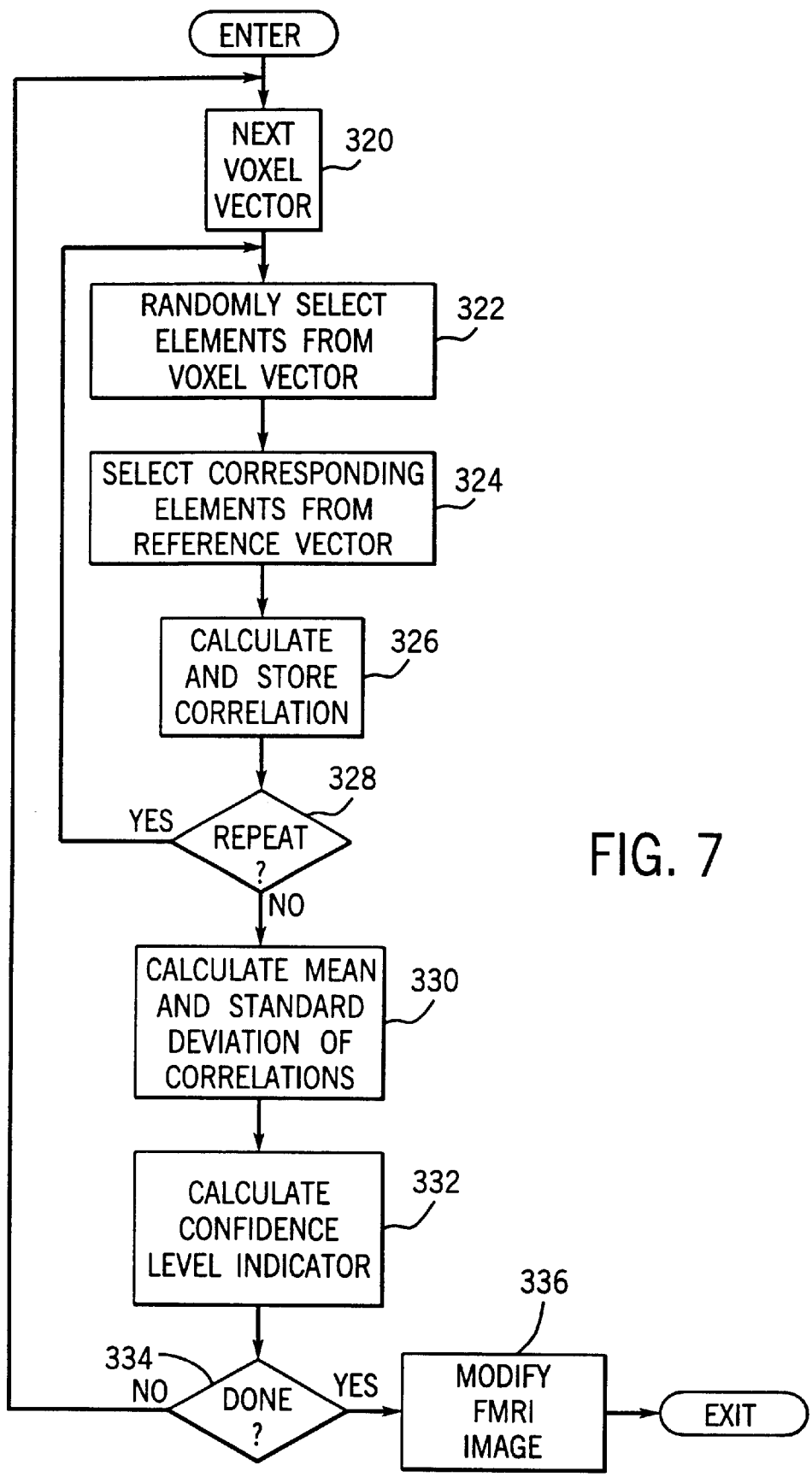
FIG. 7 is a flow chart of the steps employed to produce an fMRI image according to the present invention.

Referring particularly to FIG. 7, a loop is entered in which a 90 element voxel vector 301 is selected at process block 320. A second loop is then entered at process block 322 in which 85 elements are randomly selected from this voxel vector. The corresponding 85 elements are also selected from the reference vector as indicated at process block 324, and the correlation between these two 85 element vectors is calculated at process block 326. This "jackknife" correlation value is stored in a table. As determined at decision block 328, the system loops back to randomly select another 85 elements and calculate the corresponding jackknife correlation value. This is performed 1000 times to yield 1000 jackknife correlation values.

The particulars of this process are as follows. Each selected voxel vector 302 is entered into a table, and next to it is placed a series of 90 numbers generated by the computer's random function. The latter numbers are then sorted in ascending order, each being moved with the corresponding value from the voxel vector 302. The reference voxel vector is also changed accordingly. Once rearranged, the first 85 fMRI elements, having been chosen randomly from 90 data points, are cross-correlated with the respective reordered reference voxel vector. Because the random function produces a different series of numbers each time, the sequence of data points is always different. Therefore, the 1000 sets of data all vary slightly. From a small sample, the jackknife process produces an entire theoretical population of data, from which a reliable distribution and variability may be obtained. Thus, from only 90 images, the jackknife technique generates $4.395 \times 10^7$ (90!/85!5!) unique samples, each containing 85 elements.

Figure 6:
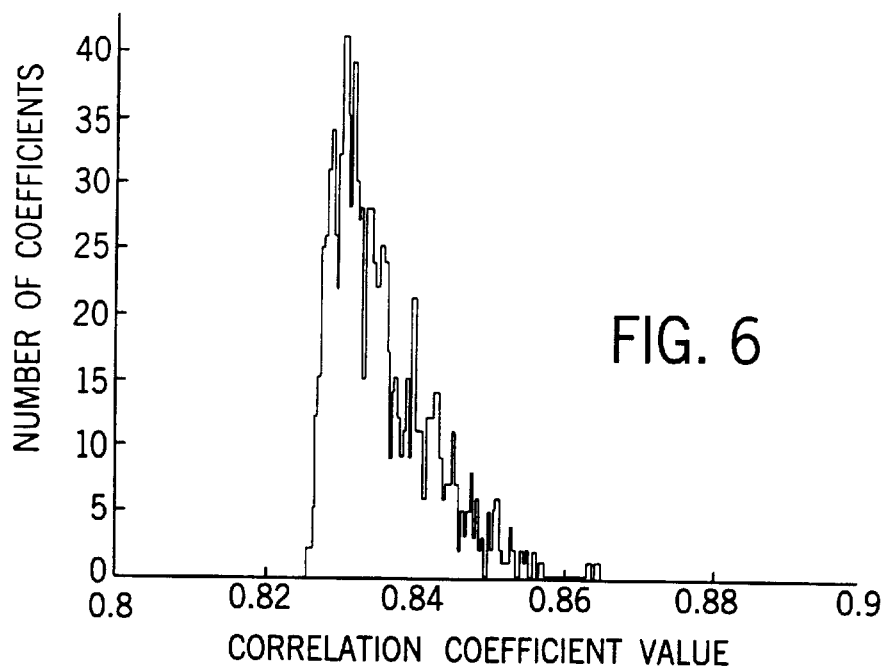
FIG. 6 is a histogram of the jackknife correlation values produced in accordance with the present invention.

If all were perfect, each calculated correlation value would be the same (e.g. 0.8436 in the example voxel vector in FIG. 4). But of course, such is never the case and the correlation values will extend over a range. A histogram of the jackknife correlation values calculated for the voxel vector of FIG. 4 and reference vector of FIG. 5 is depicted in FIG. 6. The 1000 jackknife correlation values are distributed primarily from 0.82 to 0.86. As indicated at process block 330, the mean of these jackknife correlation values is calculated as well as the standard deviation. These statistical values provide the basis for calculating a confidence level indicator at process block 332. In the preferred embodiment a confidence interval is calculated.

The process continues, as determined at decision block 334, to calculate confidence intervals for each voxel vector 302 in the data set 301. When these calculations are completed, therefore, each voxel vector 302 has associated with it a correlation value which is indicative of the degree of brain activity and a confidence interval which is a statistical indication of the accuracy of this correlation value.

Referring still to FIG. 7, in the preferred embodiment the fMRI image is modified using the calculated confidence intervals as indicated at process block 336. More particularly, even though the correlation value for a voxel vector is high enough to indicate that its image pixels are active, if its corresponding confidence interval does not exceed a threshold value, the image pixels are not modulated to indicate brain activity. This confidence interval threshold may be preset for each scan and typically might be set to around e.g. 85%.

With the use of confidence intervals of the correlation coefficient distributions, fMRI activation maps are obtained that have equal statistical significance at each pixel. Thus, the intrinsic variability of the impulse response function and the different noise levels present at each pixel is taken into account while generating the statistical significance of the activation map. This is in contrast to applying a fixed threshold value for the correlation coefficients, where it is assumed that both the impulse response function and the noise are constant among all the pixels.

What is claimed is:

1. A method for producing a functional magnetic resonance image (fMRI) of a subject's brain using a magnetic resonance imaging (MRI) system, the steps comprising:

a) operating the MRI system to perform a series of pulse sequences that acquire a series of NMR k-space data arrays over a period of time, during which the subject's brain is caused to function in a preselected temporal pattern;

b) producing a time course MRI image data set of time domain voxel vectors from the series of k-space arrays, in which each time domain voxel vector is a set of data which indicates the NMR signal during said period of time from a region of the brain;

c) calculating an fMRI parameter from data in each time domain voxel vector;

d) calculating a confidence level indicator for each voxel vector using a technique in which the fMRI parameter is recalculated a plurality of times with different truncated subsets of data in the voxel vector;

e) producing the fMRI image using the calculated fMRI parameters and their corresponding confidence level indicators.

2. The method as recited in claim 1 in which the fMRI parameter is a correlation number produced by comparing each time domain voxel vector with a reference voxel vector.

3. The method as recited in claim 2 in which step d) includes:

i) comparing each truncated subset of data in the voxel vector with a corresponding truncated reference voxel vector; to produce a recalculated correlation number; and ii) calculating the confidence level indicator from statistical information derived from the recalculated correlation numbers.

4. The method as recited in claim 3 in which the confidence level indicator is a confidence interval.

5. The method as recited in claim 1 in which step e) is performed by i) determining which regions of the brain are active by comparing the fMRI parameter for each region with a threshold value;

ii) determining which calculated fMRI parameters are reliable by comparing their corresponding confidence level indicator with a confidence threshold; and iii) indicating a region of the brain as active in the fMRI image if it is determined to be active and its calculated fMRI parameter is determined to be reliable.

* * * * *